US012586883B2

(12) United States Patent
Pu et al.

(10) Patent No.: US 12,586,883 B2
(45) Date of Patent: Mar. 24, 2026

(54) FILTER UNIT, ANTENNA FILTER UNIT AND RADIO UNIT

(71) Applicant: Telefonaktiebolaget LM Ericsson (publ), Stockholm (SE)

(72) Inventors: Jin Pu, Beijing (CN); Junming Li, Beijing (CN); Xueyuan Zhang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 319 days.

(21) Appl. No.: 18/028,715

(22) PCT Filed: Sep. 29, 2020

(86) PCT No.: PCT/CN2020/119003
§ 371 (c)(1),
(2) Date: Mar. 27, 2023

(87) PCT Pub. No.: WO2022/067553
PCT Pub. Date: Apr. 7, 2022

(65) Prior Publication Data
US 2023/0361442 A1      Nov. 9, 2023

(51) Int. Cl.
*H01P 1/208*          (2006.01)
*H01P 3/12*           (2006.01)
(Continued)

(52) U.S. Cl.
CPC ................ *H01P 1/208* (2013.01); *H01P 3/12* (2013.01); *H01Q 1/38* (2013.01); *H05K 9/0026* (2013.01)

(58) Field of Classification Search
CPC .......... H01P 1/2053; H01P 1/207; H01P 7/06; H01P 1/2084; H01P 7/10; H01P 1/213;
(Continued)

(56)                 References Cited
U.S. PATENT DOCUMENTS 6,233,434 B1      5/2001   Takei
6,329,949 B1      12/2001  Barnett et al.
(Continued)

FOREIGN PATENT DOCUMENTS

CN          1639866 A       7/2005
CN          101924262 A     12/2010
(Continued)

OTHER PUBLICATIONS

Extended European Search Report for European Patent Application No. 20955578.8, mailed May 31, 2024, 8 pages.
(Continued)

*Primary Examiner* — John W Poos
(74) *Attorney, Agent, or Firm* — Sage Patent Group

(57)                 ABSTRACT

The present disclosure relates to a filter unit, including: a cavity filter including a hollow main body, with an inner-side surface of the main body defining a closed cavity for housing resonance elements, the main body is formed by joining a filter chassis part and a filter cover part covering the filter chassis part, wherein an outer-side surface of the filter chassis part or the filter cover part facing a radio board that is to be electrically coupled with the cavity filter is metalized in such a manner that a metal layer formed thereby is configured as an electromagnetic compatibility (EMC) cover for blocking the radio board from electromagnetic interference. Also, the present disclosure relates to an antenna filter unit including the above-said filter unit and a radio unit including the above-said filter unit or the antenna filter unit.

18 Claims, 15 Drawing Sheets

(51) Int. Cl.
   *H01Q 1/38* (2006.01)
   *H05K 9/00* (2006.01)
(58) Field of Classification Search
   CPC .......... H01P 11/007; H01P 7/04; H01P 1/208;
                H01P 1/045; H01P 3/12; H01P 1/202;
                H01P 1/205; H01P 1/20; H01P 1/2056;
                H01P 1/00; H01P 1/20336; H01P 1/212;
                H01P 11/008; H01Q 1/38; H05K 9/0026;
                                                  H04B 1/00
   See application file for complete search history.

(56) References Cited

U.S. PATENT DOCUMENTS

| | | | |
|---|---|---|---|
| 11,322,836 | B2 | 5/2022 | Kim et al. |
| 11,387,564 | B2 | 7/2022 | Kim et al. |
| 2001/0018793 | A1 | 9/2001 | McKinnon et al. |
| 2004/0001299 | A1 | 1/2004 | van Haaster et al. |
| 2005/0174749 | A1* | 8/2005 | Liikamaa .............. H01P 1/2053 |
| | | | 361/799 |
| 2005/0225411 | A1 | 10/2005 | Sauder et al. |
| 2009/0153271 | A1 | 6/2009 | Park et al. |
| 2011/0032158 | A1 | 2/2011 | Rodger et al. |
| 2012/0098613 | A1* | 4/2012 | Han ...................... H03J 1/0008 |
| | | | 333/17.1 |
| 2012/0115548 | A1 | 5/2012 | Shimizu et al. |
| 2012/0293279 | A1 | 11/2012 | Gong et al. |
| 2017/0033468 | A1 | 2/2017 | Wong |
| 2017/0098877 | A1 | 4/2017 | Purna et al. |
| 2017/0256867 | A1 | 9/2017 | Ding et al. |
| 2019/0103682 | A1 | 4/2019 | Thai et al. |
| 2019/0268046 | A1 | 8/2019 | Kim et al. |
| 2020/0287260 | A1 | 9/2020 | Kim et al. |
| 2021/0143558 | A1 | 5/2021 | LeBlanc et al. |
| 2021/0203078 | A1 | 7/2021 | Lin et al. |
| 2021/0328365 | A1 | 10/2021 | Zhang et al. |
| 2021/0359415 | A1 | 11/2021 | Takaki et al. |
| 2022/0320743 | A1 | 10/2022 | Igarashi |

FOREIGN PATENT DOCUMENTS

| | | | | |
|---|---|---|---|---|
| CN | 202585692 | U | 12/2012 | |
| CN | 203503762 | U | 3/2014 | |
| CN | 204793134 | U | 11/2015 | |
| CN | 106165196 | A | 11/2016 | |
| CN | 107171075 | A | 9/2017 | |
| CN | 107221747 | A | 9/2017 | |
| CN | 107706544 | A | 2/2018 | |
| CN | 108461927 | A | 8/2018 | |
| CN | 108767447 | A | 11/2018 | |
| CN | 109301496 | A | 2/2019 | |
| CN | 208939141 | U | 6/2019 | |
| CN | 110011072 | A | 7/2019 | |
| CN | 110165397 | A | 8/2019 | |
| CN | 110380191 | A | 10/2019 | |
| CN | 209948056 | U | 1/2020 | |
| EP | 1133064 | B1 | 8/2002 | |
| EP | 2270926 | A1 | 1/2011 | |
| EP | 2894710 | A1 | 7/2015 | |
| WO | WO-2014075457 | A1 * | 5/2014 | ........... H01P 1/2053 |
| WO | 2016202687 | A1 | 12/2016 | |
| WO | 2019139281 | A1 | 7/2019 | |
| WO | 2020153760 | A1 | 7/2020 | |

OTHER PUBLICATIONS

Extended European Search Report for European Patent Application No. 19958070.5 dated Aug. 17, 2023, 10 pages.
International Search Report and Written Opinion of the International Searching Authority, PCT/CN2020/119003, mailed Jun. 30, 2021, 10 pages.
International Preliminary Report on Patentability of the International Preliminary Examining Authority, PCT/CN2020/119003, mailed Dec. 14, 2022, 16 pages.
Second Office Action mailed Jun. 24, 2025, Chinese Application No. 202080105627.7, 21 pages.

* cited by examiner

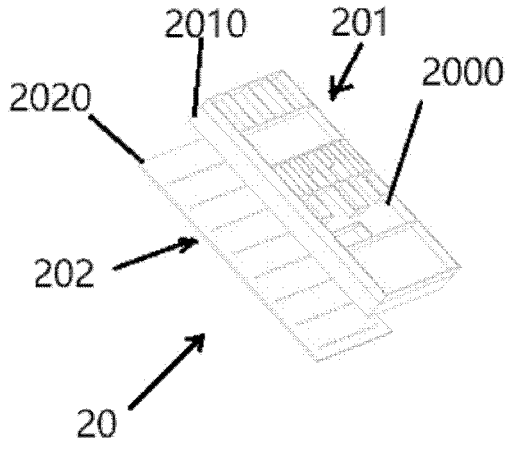
FIG.4A
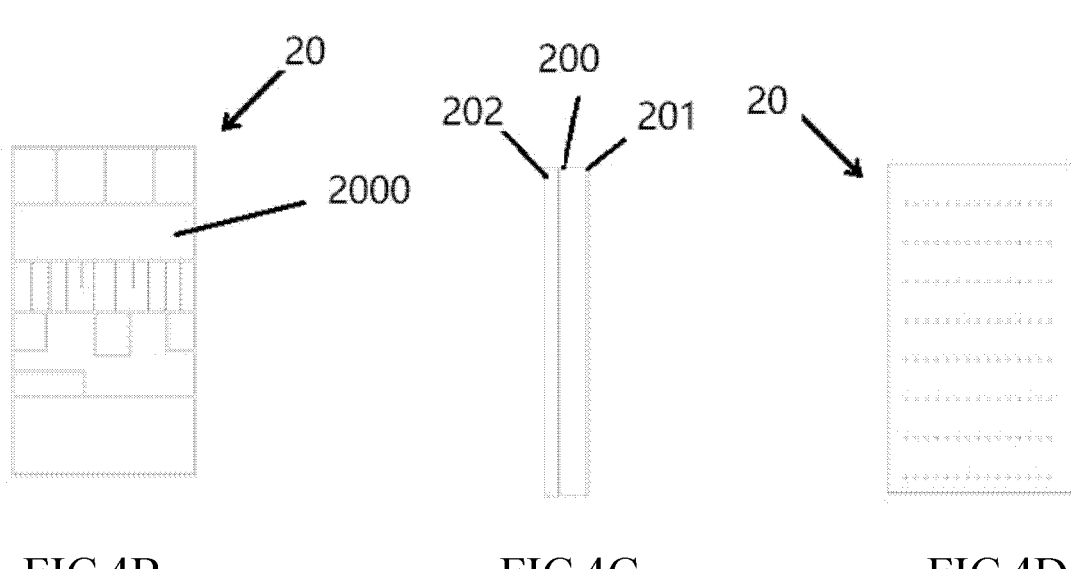
FIG.4B                    FIG.4C                    FIG.4D

30

301

302

3100

300

301

302

3000

FILTER UNIT, ANTENNA FILTER UNIT AND RADIO UNIT

CROSS REFERENCE TO RELATED APPLICATIONS

This application is a 35 U.S.C. § 371 national stage application of PCT International Application No. PCT/CN2020/119003 filed on Sep. 29, 2020, the disclosure and content of which is incorporated by reference herein in its entirety.

TECHNICAL FIELD

The present disclosure generally relates to the technical field of communication device, and more particularly, to a filter unit, an antenna filter unit, a radio unit comprising the filter unit or the antenna filter unit.

BACKGROUND

This section introduces aspects that may facilitate better understanding of the present disclosure. Accordingly, the statements of this section are to be read in this light and are not to be understood as admissions about what is in the prior art or what is not in the prior art.

Base station (BS) is an important part of a mobile communication system, and may include a radio unit (RU) and an antenna unit (AU). In traditional BS solution, remote radio unit (RRU) and AU are separated as two independent units and hung on high constructions, like tall buildings, high walls, towers and lamp stands. Considering the installation/fixation/occupation, smaller volume and lighter weight is always an important evolution direction in BS design.

Nowadays, for achieving more compact structure, many products, such as an advanced antenna system (AAS), a Micro station, a Street Micro station, a Small cell station, etc. integrate an antenna into the radio unit. The main method available for reducing volume and weight for these products is to reduce the size of each component to its minimum.

In existing technology, for a FU, a metal cavity filter is widely used, which consists of a cover part and a chassis part. Also, given the requirement of providing enough electromagnetic shielding performance, an electromagnetic compatibility (EMC) cover is always adopted, which is made by metal materials (for example, aluminum) as well. For an antenna part, it always consists of a metal reflector, a micro-strip line feeding network and metal radiators. All the metal materials used will inevitably increase the weight of the final product.

Also, for a traditional AU of an AAS product consisting of a reflector, a feeding network board and an antenna element, its structure is very complicated and often leads to high height (or big size) and heavy weight. Since two high-performance PCB boards are needed also for realizing a feeding network and antenna calibration respectively, the cost is always very high.

Furthermore, in a traditional Classic Radio product 1' as shown in FIGS. 1A and 1B, a FU 12' and an EMC cover 11' and a frame assembly 10' housing a radio board are separate modules, which significantly increases the complexity of system building practice. In view that the FU is usually consisted of two parts, i.e. a cover part and a chassis part, more components are actually involved during assembling, which thus increases the difficulty in assembling and results in high cost of this implementation. Moreover, due to bad grounding, a huge challenge arises in terms of an EMC issue.

In a traditional AAS product 2' as shown in FIGS. 2A and 2B, an AU 13', a FU 12', an EMC cover 11' and a frame assembly 10' housing a radio board are separate components, which therefore arouses same issues and concerns as those with respect to the traditional Classic Radio product 1'. Also, the complicated structure is risky for an AAS product which is required to have high PIM (passive inter-modulation) performance.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide an improved solution for a FU or an AFU or a radio unit which enables high integration at reduced size and weight as well as reduced assembly cost.

According to a first aspect of the disclosure, there is provided a filter unit, comprising a cavity filter which comprises a hollow main body, with an inner-side surface of the main body defining a closed cavity for housing resonance elements. The main body is formed by joining a filter chassis part and a filter cover part covering the filter chassis part. An outer-side surface of the filter chassis part or the filter cover part facing a radio board that is to be electrically coupled with the cavity filter is metalized in such a manner that a metal layer formed thereby is configured as an electromagnetic compatibility (EMC) cover for blocking the radio board from electromagnetic interference.

In an embodiment of the disclosure, the EMC cover is formed on the filter chassis part.

In an embodiment of the disclosure, the filter chassis part comprises a base portion made of plastic, and the EMC cover is shaped by integrally molding and formed by plating on the base portion of the filter chassis part.

In an embodiment of the disclosure, the EMC cover is formed on the filter cover part.

In an embodiment of the disclosure, the filter cover part comprises a base portion made of plastic, and the EMC cover is shaped by integrally molding and formed by plating on the base portion of the filter cover part.

In an embodiment of the disclosure, a connecting structure for the coupling between the radio board and the cavity filter is provided, comprising a protrusion integrally formed with the base portion on which the EMC cover is to be integrally formed and protruding towards the radio board, wherein the protrusion comprises a hole which is provided for coaxially holding a pin towards the radio board, or an inner side of the hole is metalized without the need of inserting a pin therethrough.

In an embodiment of the disclosure, the filter chassis part comprises a base portion made of plastic, and an antenna port is integrally formed during molding of the base portion of the filter chassis part.

According to a second aspect of the disclosure, there is provided an antenna filter unit, comprising the above-said filter unit and an antenna unit electrically coupled with the filter unit. The antenna unit comprises radiators and a feeding network that are integrally formed on an outer-side surface of one of the filter chassis part and the filter cover part, and a reflector integrally formed on an inner-side surface of the one of the filter chassis part and the filter cover part. The EMC cover is integrally formed on an outer-side surface of the other one of the filter chassis part and the filter cover part.

In an embodiment of the disclosure, the feeding network and the radiators are integrally formed on the outer-side surface of the filter cover part.

In an embodiment of the disclosure, the filter cover part comprises a base portion made of plastic, and the radiators are formed on an outer side of the base portion of the filter cover part facing away from the filter chassis part, by integrally molding radiator structures on the base portion of the filter cover part and applying a plastic plating method to surfaces of the radiator structures molded, and the feeding network is integrally formed by a plastic plating method on the outer side of the base portion of the filter cover part.

In an embodiment of the disclosure, the reflector is integrally formed by a plastic plating method on an inner side of the base portion of the filter cover part facing the filter chassis part.

In an embodiment of the disclosure, the feeding network and the radiators are integrally formed on the outer-side surface of the filter chassis part.

In an embodiment of the disclosure, the filter chassis part comprises a base portion made of plastic, and the radiators are formed on an outer side of the base portion of the filter chassis part facing away from the filter cover part, by integrally molding radiator structures on the base portion of the filter chassis part and applying a plastic plating method to surfaces of the radiator structures molded, and the feeding network is integrally formed by a plastic plating method on the outer side of the base portion of the filter chassis part.

In an embodiment of the disclosure, the reflector is integrally formed by a plastic plating method on an inner side of the base portion of the filter chassis part facing the filter cover part.

In an embodiment of the disclosure, an isolation bar for reducing mutual coupling effect between radiators is formed by integrally molding a bar structure during molding of the base portion of the filter cover part or the filter chassis part and applying a plastic plating method to a surface of the bar structure molded.

In an embodiment of the disclosure, a pin or a coupling structure is provided in the antenna filter unit for signal transition or connection between the antenna unit and the filter unit.

According to a third aspect of the disclosure, there is provided a radio unit, comprising a radio board and the above-said filter unit or the above-said antenna filter unit. The filter unit or the antenna filter unit being electrically coupled to the radio board.

According to the disclosure, the filter unit proposes to utilize plastic materials as the base portions and makes metal patterns or metal layers as required by electroplating on surfaces of the base portions to realize RF performance. Since the plastic plating technology is wildly used in mobile phone antenna manufacture, its application has huge benefits in terms of cost and production without degradation on RF performance. Also, it allows producing a highly integrated filter unit or antenna filter unit with the total weight and size being significantly reduced. Total BOM (bill of materials) cost is greatly reduced since the high integration and several standalone parts/connectors/fix screws are eliminated. The assembling process is very easy since BOM content is minimized and the filter unit or antenna filter unit product is much more compact than traditional ones. The PIM performance can be greatly improved due to high integration with a reduced number of connectors and screws. Since all the key components of the highly integrated filter unit or antenna filter unit share the same grounding, the EMC performance is improved as well.

BRIEF DESCRIPTION OF THE DRAWINGS

These and other objects, features and advantages of the disclosure will become apparent from the following detailed description of illustrative embodiments thereof, which are to be read in connection with the accompanying drawings.

FIG. 4A shows the exploded view of an upside-down FEU according to a first embodiment of the present disclosure for a Classic Radio product.

FIG. 4B, FIG. 4C and FIG. 4D show the top view, the side view and the bottom view of the FEU as shown in FIG. 4A.

US 12,586,883 B2

5

6

Figure 14A:
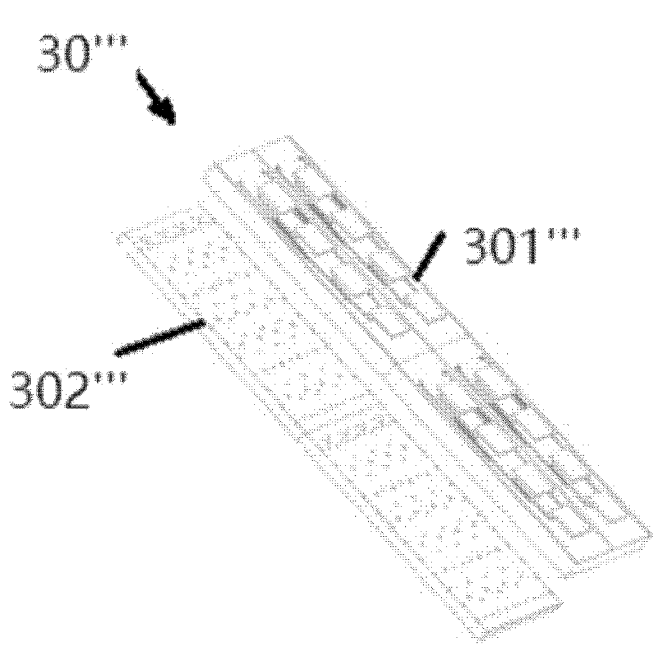

FIG. 14A shows the exploded view of an AFEU according to a fourth embodiment of the disclosure for a Street Macro RRU product.

Figures 14B, 14C, 14D:
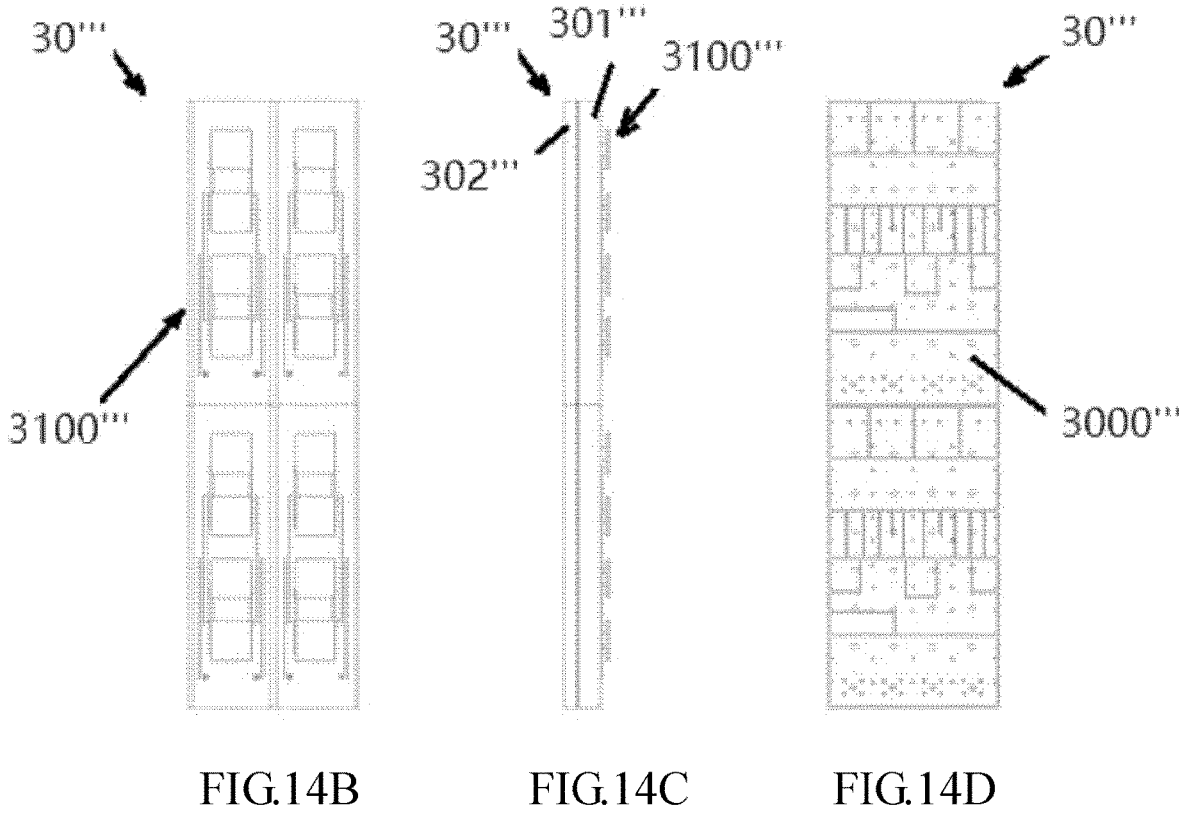

FIG. 14B, FIG. 14C and FIG. 14D show the top view, the side view and the bottom view of the AFEU as shown in FIG. 14A.

Figure 15A:
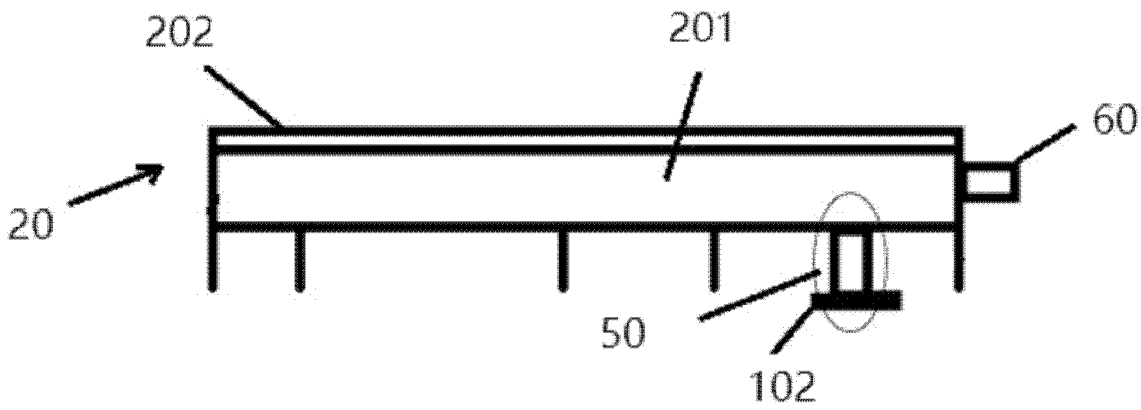
Figure 15B:
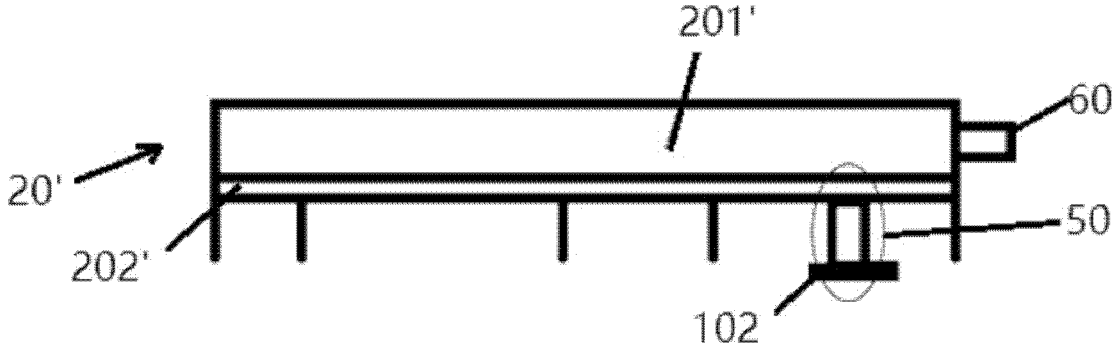

FIG. 15A and FIG. 15B show arrangements of ANT connectors for a FEU according to the first and second embodiment of the disclosure.

Figure 16A:
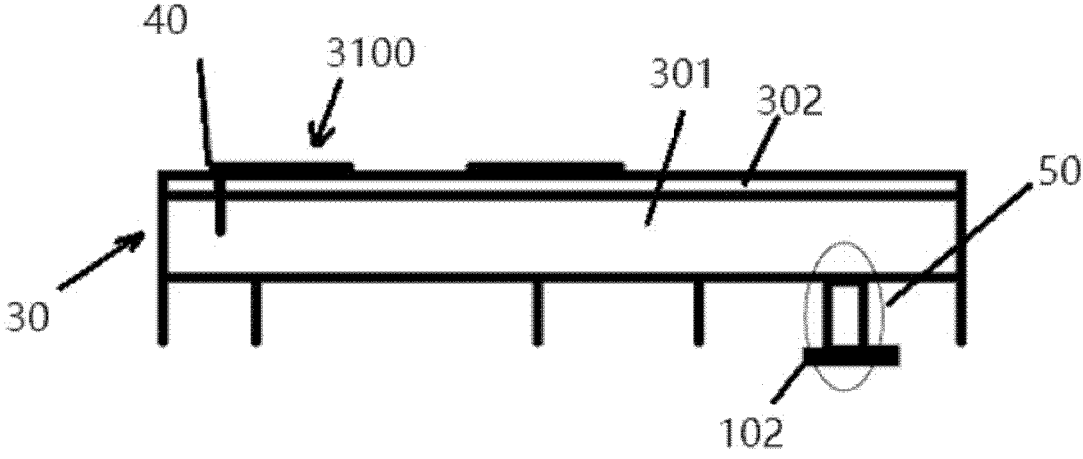
Figure 16B:
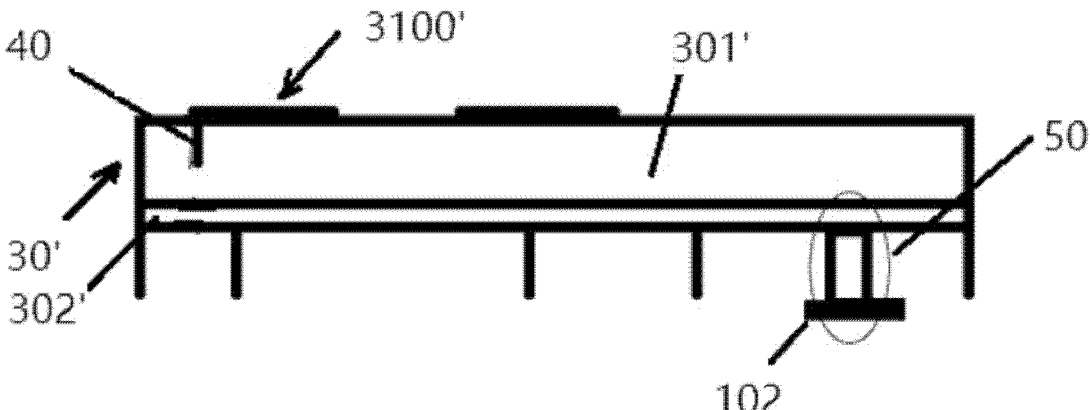

FIG. 16A and FIG. 16B show the connection for signal transition between the antenna and the filter in the AFEU according to the first and second embodiment of the disclosure.

FIG. 17A, FIG. 17B, FIG. 17C and FIG. 17D show the connections between a radio board and a FEU/AFEU according to the present disclosure.

DETAILED DESCRIPTION

The embodiments of the present disclosure are described in detail with reference to the accompanying drawings. It should be understood that these embodiments are discussed only for the purpose of enabling those skilled in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. Those skilled in the relevant art will recognize that the disclosure may be practiced without one or more of the specific features or advantages of a particular embodiment. In other instances, additional features and advantages may be recognized in certain embodiments that may not be present in all embodiments of the disclosure.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Embodiments of Filter-EMC Cover Unit (FEU) of the Present Disclosure

Figure 1A:
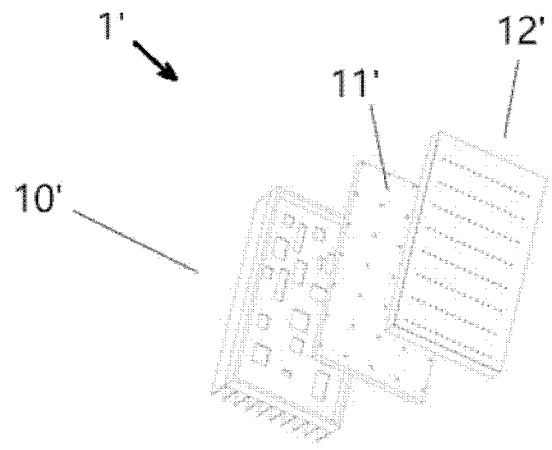
FIG. 1A and FIG. 1B show the top view and the bottom view of an existing classic radio product comprising a FU, an EMC cover and a frame assembly.
Figure 1B:
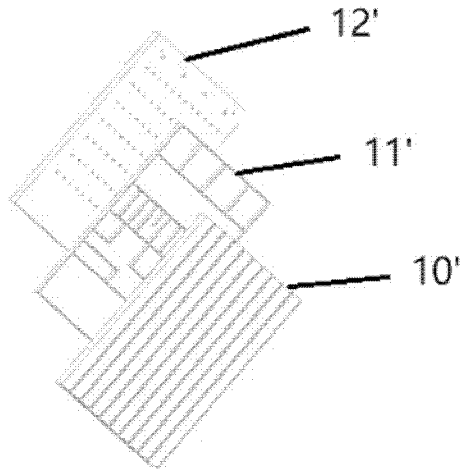
Figure 2A:
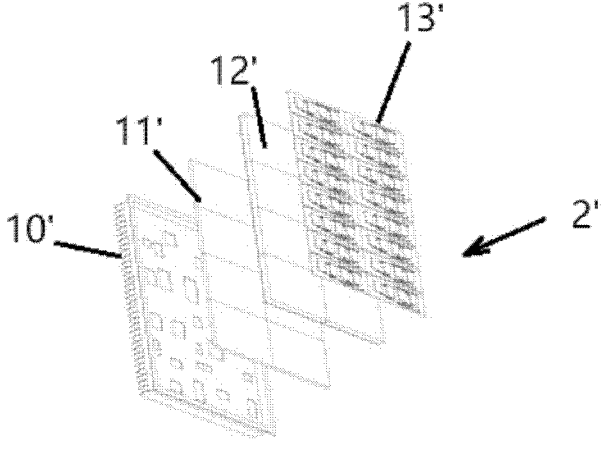
FIG. 2A and FIG. 2B show the top view and the bottom view of an existing AAS product comprising an AU, a FU, an EMC cover and a frame assembly.
Figure 2B:
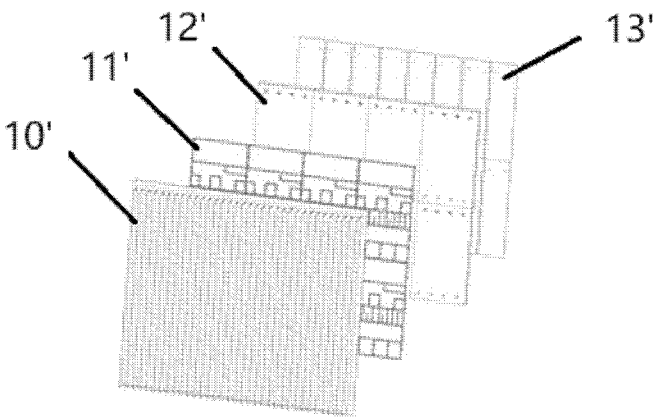
Figure 3A:
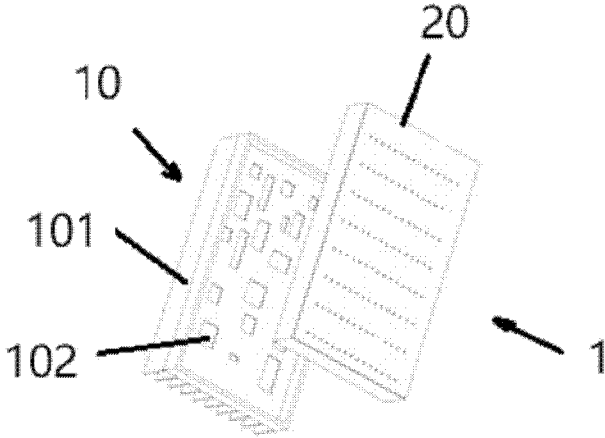
FIG. 3A and FIG. 3B show the top view and the bottom view of a radio unit according to an embodiment of the present disclosure for a classic radio product, wherein the radio unit of the present embodiment comprises a FEU and a frame assembly.
Figure 3B:
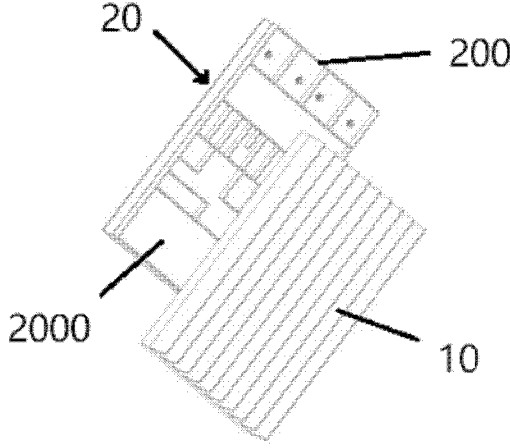

FIG. 3A and FIG. 3B show the top view and the bottom view of a radio unit 1 according to the present disclosure for a Classic Radio product, wherein the radio unit 1 comprises a FEU 20 and a frame assembly 10 comprising a frame 101 and a radio board 102 contained inside the frame. The frame 101 is provide with an upper opening that is open to the FEU. The FEU 20 is installed on top of the frame 101 and thus the upper opening of the frame is covered by the bottom of the FEU. The FEU 20 is electrically coupled with the radio board 102 inside the frame. Therefore, there are totally two separate parts, i.e. a frame assembly 10 and a FEU 20 in the Classic Radio product of the present disclosure.

According to the present disclosure, the FEU 20 comprises a cavity filter comprising a main body 200. An inner-side surface of the main body defines a closed cavity for housing resonance elements. The bottom of the FEU is embodied in the form of a cover with walls extending in the direction of the frame and therefore providing one or more recesses for housing and covering the components on the radio board. The bottom surface of the main body is metalized, allowing the recesses thereon to function as shielding cavities for the components on radio board. When the FEU is placed on top of the frame, the metalized bottom surface of the FEU can function as an electromagnetic compatibility (EMC) cover 2000 for blocking the radio board 102 inside the frame 101 from electromagnetic interference. In a word, the bottom surface of the main body 200 is used as an integral part of the filter and also as an EMC cover, or rather, a cavity filter and an EMC cover are integrated into one physical unit as a FEU (or a filter unit).

FIGS. 4A-4D show an integrated FEU 20 according to a first embodiment of the present disclosure and FIGS. 5A-5D show an integrated FEU 20 according to a second embodiment of the present disclosure.

First Embodiment of FEU

FIG. 4A shows an exploded view of an upside-down FEU 20 according to a first embodiment of the present disclosure. In the embodiment shown in FIG. 4A-4D, the main body 200 is formed by joining a filter chassis part 201 and a filter cover part 202 which is configured for covering the filter chassis part so that a closed cavity is formed therebetween for housing resonance elements therein. The filter chassis part 201 and the filter cover part 202 are joined together as a whole for example, by welding at their abutting surfaces. The filter chassis part 201 is made in a substantially plate shape and has two opposite side surfaces, i.e. the upper side surface and the lower side surface. The upper side surface faces the filter cover part 202 and the lower side surface face the radio board 102 when the main body 200 of the filter is installed well onto the frame assembly 10. The lower side surface of the filter chassis part 201 facing the radio board can also be considered as its bottom surface (see FIG. 3A). In the embodiment shown in FIG. 4A, the bottom surface of the filter chassis part 201 is metalized so that a metal layer is formed in a configuration following the relief structures integrally formed on the bottom of the filter chassis part and defining one or more recesses. Once the main body 200 is seated onto the frame 101, the upper opening of the frame is covered by the bottom surface of the filter chassis part, and the metal layer formed on the bottom of the filter chassis part (or, specifically the metalized recesses covering the components on the radio board) can then function as an electromagnetic compatibility (EMC) cover. That is to say, in the embodiment shown in FIG. 4A-4D, the EMC cover is integrally formed on the filter chassis part.

In a preferable embodiment, the filter chassis part 201 comprises a base portion 2010 made of plastic, the filter cover part 202 comprises a base portion 2020 made of plastic, and the EMC cover 2000 is shaped by integrally molding during the molding of the base portion 2010 and formed by plating on the base portion 2010 of the filter chassis part.

Specifically, the FEU according to this embodiment of the present disclosure can be manufactured as follows: 1) For the filter cover part 202, its plastic base portion 2020 is shaped by molding. As shown in FIGS. 4A and 4D, the plastic base portion 2020 of the filter cover part is substantially plate-shaped. A metal layer is formed on a side ("inner side" or "inner-side surface") of the plastic base portion 2020 facing the filter chassis part by a plastic plating method. Hence the metal layer formed thereby can enable the filter cover part to fulfil the function of filtering. An outer side of the plastic base portion 2020 may be metalized also so as to provide better grounding. 2) For the filter chassis part 201, its plastic base portion 2010 is formed into a substantially plate-like shape by molding. The plastic base portion 2010 comprises walls integrally formed on its side facing the filter cover part and defining an opened cavity which houses a plurality of protrusions integrally formed therein. These protrusions can function as resonance structures. This side of the plastic base portion 2010 facing the filter cover part (hereinbelow, it can be referred to as "inner side") can be metalized by a plastic plating method. On the opposite side (i.e. "outer side") of the plastic base portion 2010 serving as the bottom surface of the filter chassis part 201, relief structures are integrally molded, defining one or more recesses for housing the components on the radio board. A metal layer may be formed on the outer side of the plastic base portion 2010 by a plastic plating method such that it follows the relief structures on the bottom of the plastic base portion 2010. Thus, the more recesses are metalized on their surfaces. Once the FEU is mounted on the frame assembly, the metalized recesses houses the components on the radio board, providing shielding function for the radio board. Therefore, the metal layer formed on the bottom of the plastic base portion 2010 provides function of grounding on one hand, and on the other hand is used as an EMC cover. By doing so, the filter chassis part (or rather, the cover-like metalized recesses formed thereon) can function as a shielding cover for the radio board.

Second Embodiment of FEU

Figure 5A:
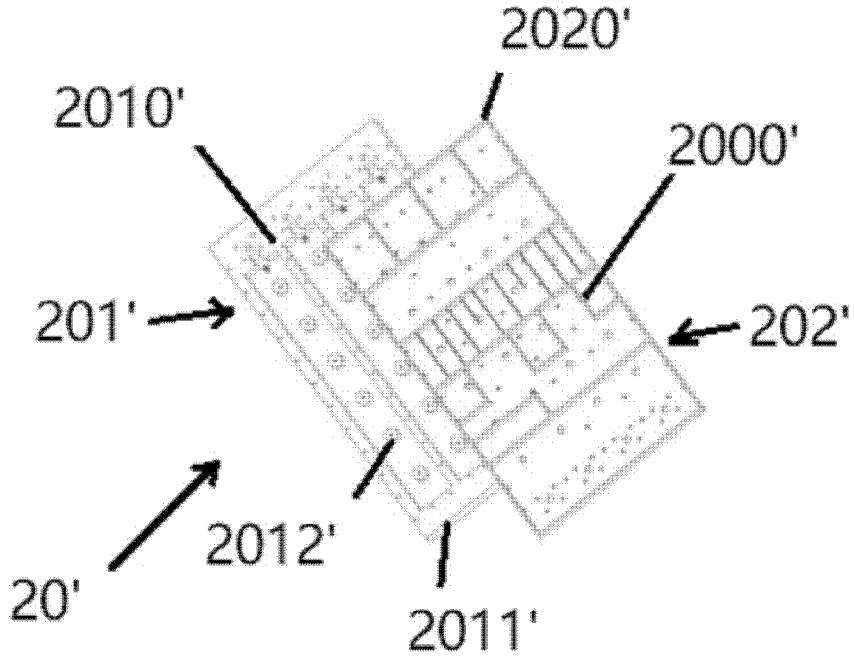
FIG. 5A shows the exploded view of an upside-down FEU according to a second embodiment of the present disclosure for a Classic Radio product.
Figures 5B, 5C, 5D:
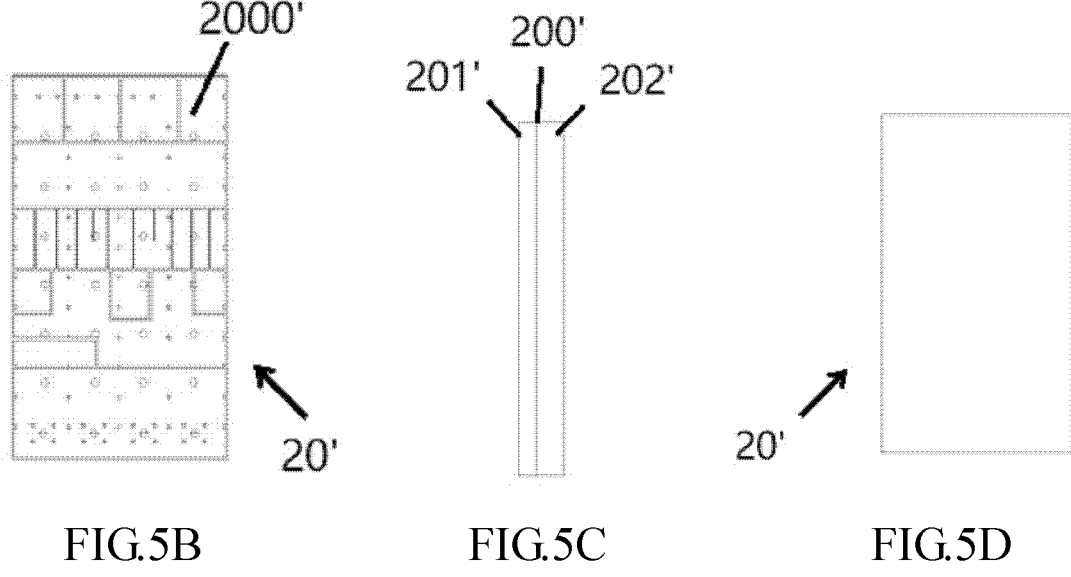
FIG. 5B, FIG. 5C and FIG. 5D show the top view, the side view and the bottom view of the FEU as shown in FIG. 5A.

FIG. 5A shows an upside-down FEU 20' according to a second embodiment of the present disclosure. Different from the embodiment shown in FIG. 4A-4D, the embodiment shown in FIG. 5A integrates the EMC cover 2000' into the filter cover part 202' rather than into the filter chassis part 201'.

In this embodiment, it is the filter cover part 202' of the main body 200' that directly covers the upper opening of the frame 101 housing the radio board 102. As for the filter cover part 202', it comprises a base portion made of plastic. A side ("inner side") of the plastic base portion 2020' facing the filter chassis part can be metalized by a plastic plating method so that it can play the role as a filter cover. The opposite side ("outer side") of the plastic base portion 2020', which comprises one or more recesses defined by relief structures integrally molded during the molding of the plastic base portion, can be metalized by a plastic plating method so that the metalized recesses housing the components on the radio board can function as a whole as an EMC cover 2000' for the radio board.

The filter chassis part 201' comprises a base portion 2010' made of plastic. The plastic base portion 2010' can be formed by a plastic molding method into shapes as required. A cavity 2011' housing resonance structures 2012' is formed on the side ("inner side") of the plastic base portion 2010' facing the filter cover part. The inner-side surface of the plastic base portion 2010' can be metalized by a plastic plating method. The opposite side ("outer side") of the plastic base portion 2010' facing away from the filter cover part 202' can be metalized by a plastic plating method also so that it can provide better grounding.

Although the first and second embodiments of a FEU shown in the above is used in a Classic Radio product, the integrated FEU can also be applied to 2G/3G/4G base station antenna (BSA).

Figure 6A:
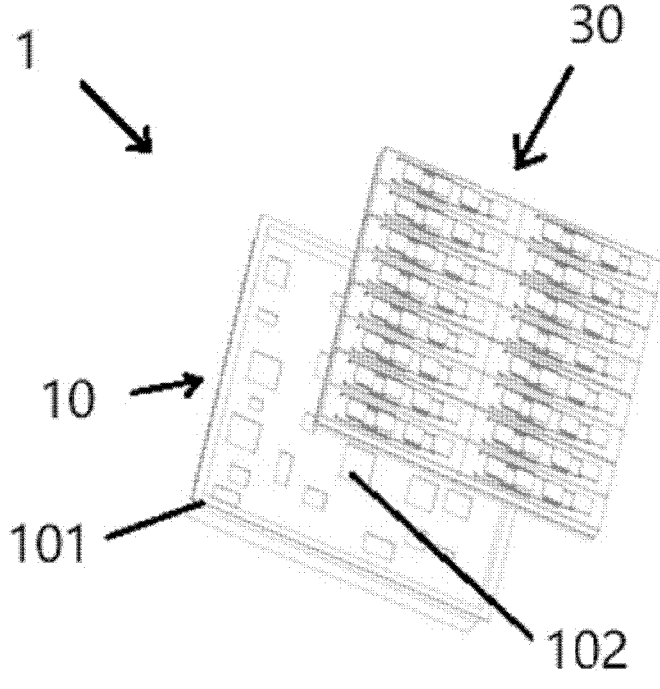
FIG. 6A and FIG. 6B show the top view and the bottom view of a radio unit according to an embodiment of the present disclosure for 5G AAS product, wherein the radio unit of the present embodiment comprises an AFEU and a frame assembly.
Figure 6B:
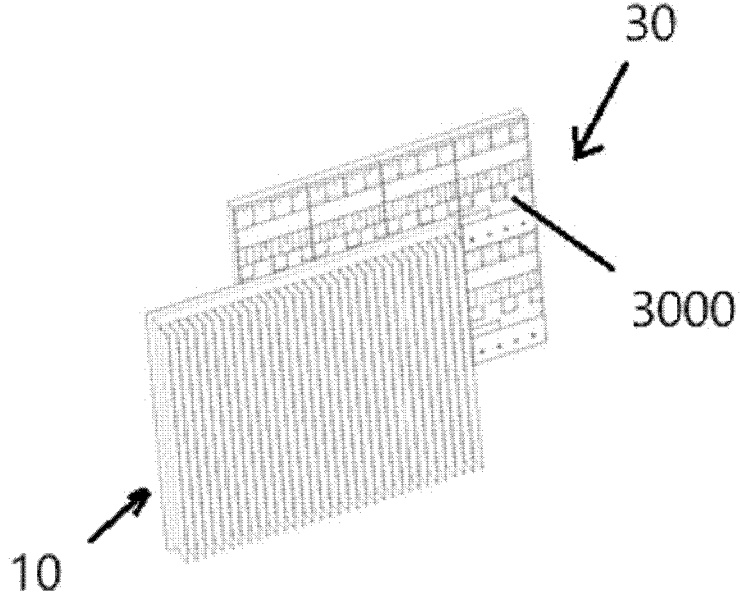
Figure 7A:
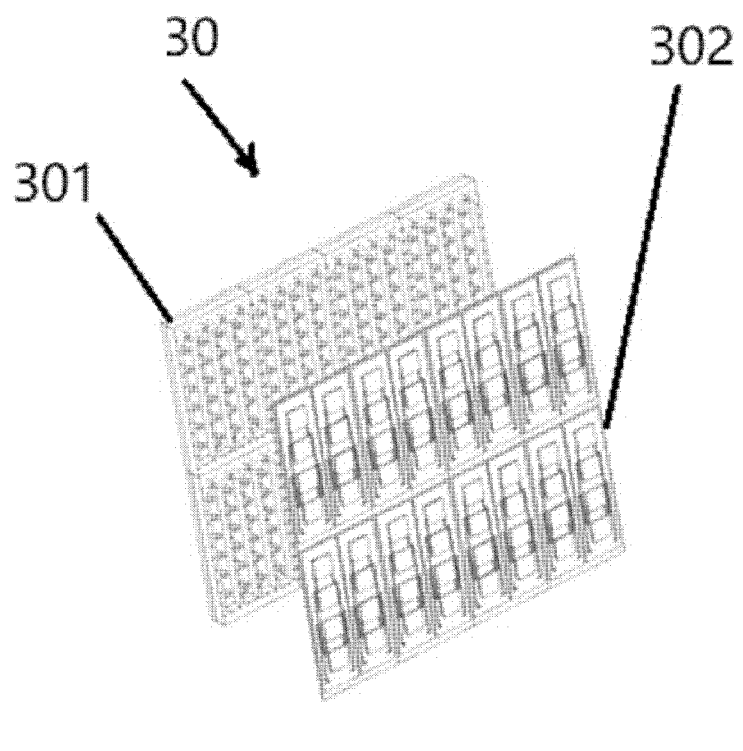
FIG. 7A shows the exploded view of an AFEU according to a first embodiment of the disclosure for a 5G AAS product.
Figures 7B, 7C, 7D:
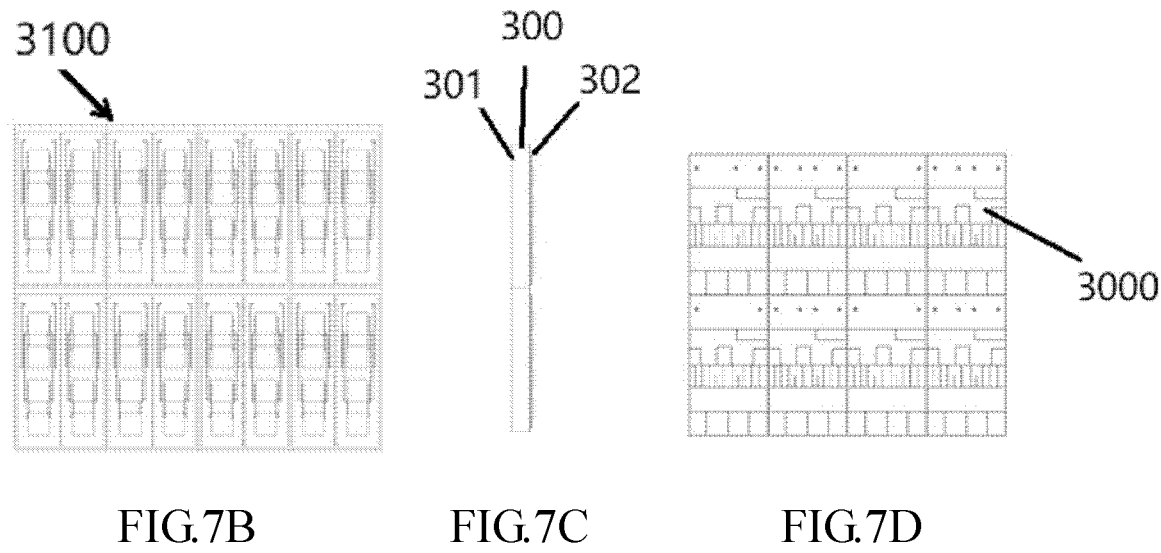
FIG. 7B, FIG. 7C and FIG. 7D show the top view, the side view and the bottom view of the AFEU as shown in FIG. 7A.

Embodiments of Antenna-Filter-EMC Cover Unit (AFEU) of the Present Disclosure FIGS. 6A and 6B show the top view and the bottom view of the radio unit 1 of the present disclosure for 5G AAS product, which comprises an AFEU 30 and a frame assembly 10 with a frame 101 containing a radio board 102 to be electrically coupled with the AFEU. The AFEU 30 is formed by integrating an antenna unit 3100 and EMC cover 3000 into a cavity filter as one unit. In the embodiment shown, there are totally two parts, i.e. an AFEU 30 and a frame assembly 10 in the AAS radio product of the present disclosure.

First Embodiment of AFEU

Figures 8A, 8B, 8C:
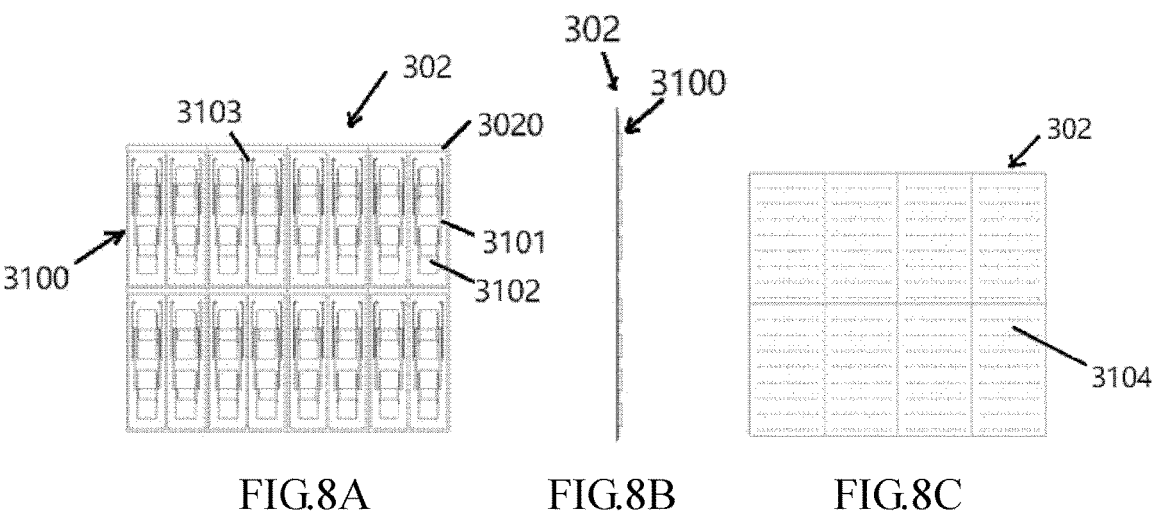
FIG. 8A, FIG. 8B and FIG. 8C show the top view, the side view and the bottom view of a filter cover part of the AFEU as shown in FIG. 7A.
Figures 9A, 9B, 9C:
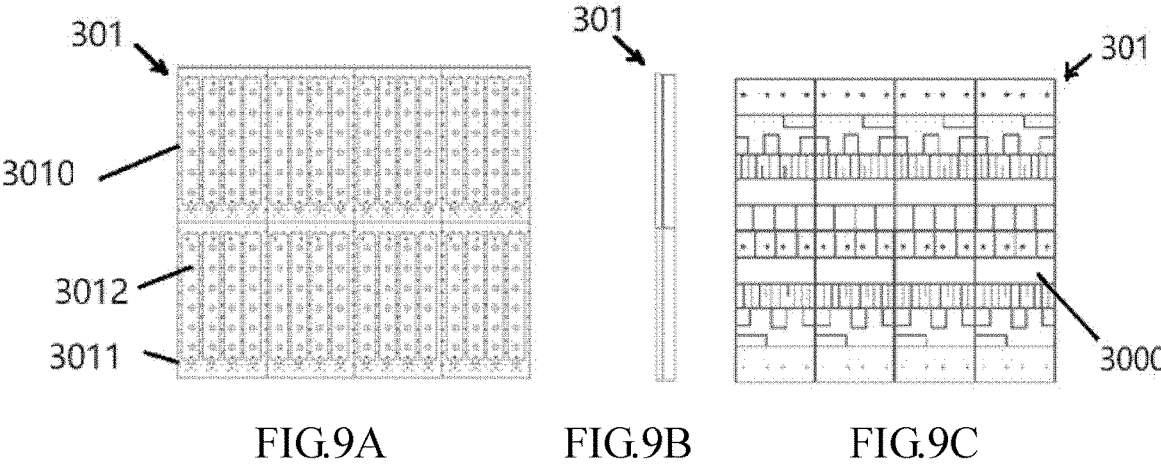
FIG. 9A, FIG. 9B and FIG. 9C show the top view, the side view and the bottom view of a filter chassis part of the AFEU as shown in FIG. 7A.
Figure 10A:
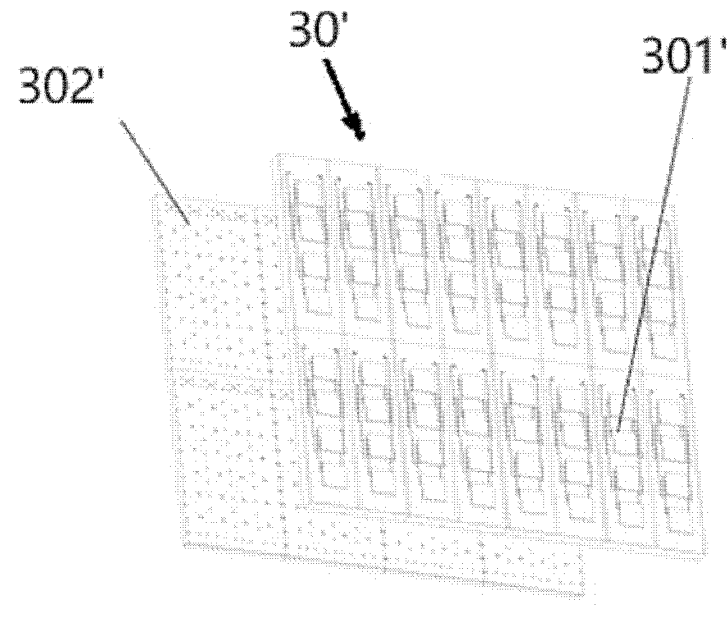
FIG. 10A shows the exploded view of an AFEU according to a second embodiment of the disclosure for a 5G AAS RRU product.
Figures 10B, 10C, 10D:
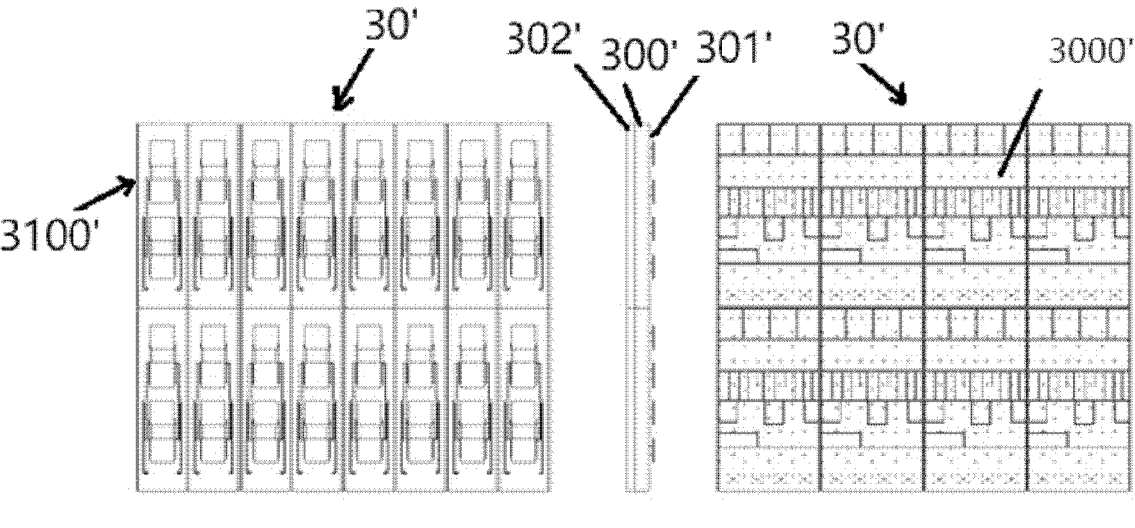
FIG. 10B, FIG. 10C and FIG. 10D show the top view, the side view and the bottom view of the AFEU as shown in FIG. 10A.

FIGS. 7A-7D show an AFEU 30 according to a first embodiment of the present disclosure. The core member of the AFEU is a main body 300 defining a cavity filter which is formed by joining a filter chassis part 301 and a filter cover part 302, for example, by welding. As shown in FIGS. 8A-8C, the filter cover part 302 of the AFEU 30 has an antenna unit 3100 integrated thereinto. FIGS. 9A-9C show that an EMC cover 3000 is integrated into the filter chassis part 301.

As part of the antenna unit 3100, the feeding network 3101 comprising a plurality of micro-strip lines is electrically coupled to the radiators 3102, making it possible to transmit the signal to be sent out by the feeding network 3101 to the radiators 3102 and the signal received by the radiators 3102 to the feeding network 3101.

The filter cover part 302 comprises a base portion 3020 made of plastic. The plastic base portion 3020 can be made by molding into a shape as required. The feeding network 3101 of the antenna unit 3100 is integrally formed by a plastic plating method on the top side of the plastic base portion 3020. The radiators 3102 of the antenna unit 3100 are formed by integrally molding radiator structures during the molding of the base portion 3020 and then plating surfaces of the radiator structures molded. Isolation bars 3103 provided between groups of the radiators 3102 can be integrally formed by integrally molding bar structures during the molding of the base portion 3020 and then plating on the surfaces of the bar structures by a plastic plating method. With these isolation bars, mutual coupling effect between different groups of radiators can be reduced. The bottom side of the plastic base portion 3020 is metalized by a plastic plating method. The metal layer formed by the metallization on the bottom side of the plastic base portion 3020 plays as a reflector 3104 for the antenna unit 3100. The metal layer serving as the reflector functions to gather the antenna signal on the corresponding radiators, so as to enhance receiving ability of the antenna unit. Also, it can be used to block or shield the interference signal from the back of the plastic base portion 3020, so as to avoid the antenna unit from being interfered when it is receiving an antenna signal. Hence, feeding network 3101, radiators 3102, isolation bars 3103 and the reflector 3104 of the antenna unit 3100 are all integrally formed on the base portion 3020 so that one single filter cover part 302 with an antenna function is formed, as shown in FIG. 8A-8C.

The filter chassis part 301 comprises a base portion 3010 made of plastic. The plastic base portion 3010 can be shaped simply by molding. The plastic base portion 3010 comprises walls on its upper side which facing the filter cover part. The walls define a cavity 3011 in which resonance structures 3012 are housed. The resonance structures are integrally formed during the molding of the plastic base portion 3010. The inner side surface of the cavity 3011 of the plastic base portion 3010 is metalized by a plastic plating method. The EMC cover 3000 is integrally formed by a plastic plating method on the bottom side of the plastic base portion 3010 provided with recesses integrally molded for housing components of the radio board. As shown in FIGS. 9A-9C, the filter chassis part 301 has resonance structures 3012 on its upper side and metallized recesses functioning as an EMC cover 3000 on its lower side.

Second Embodiment of AFEU

Figures 11A, 11B, 11C:
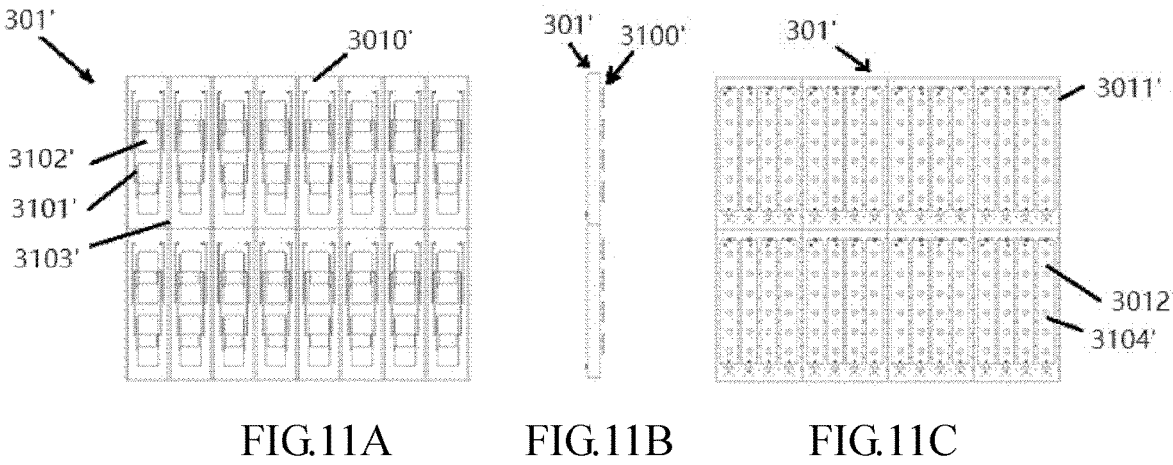
FIG. 11A, FIG. 11B and FIG. 11C show the top view, the side view and the bottom view of a filter chassis part of the AFEU as shown in FIG. 10A.
Figures 12A, 12B, 12C:
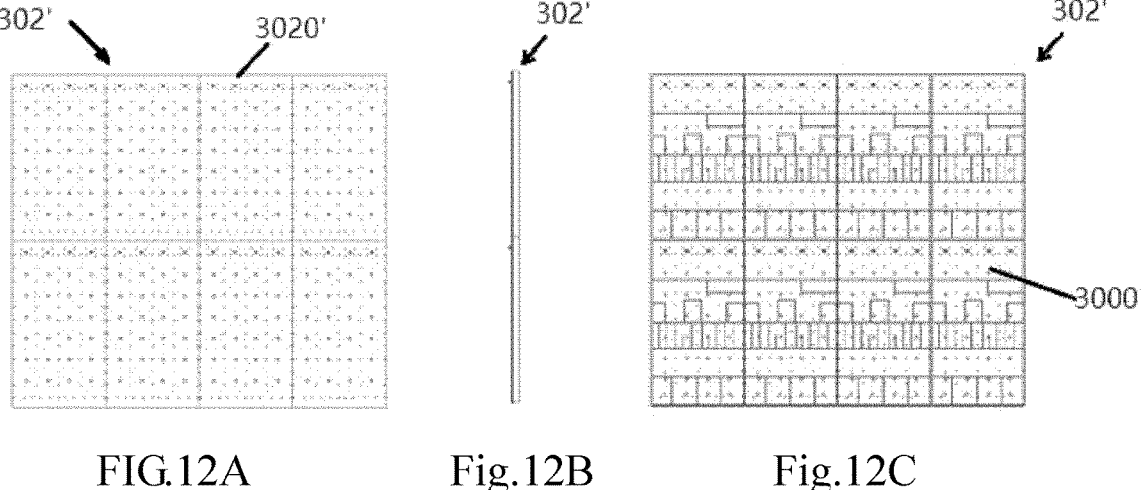
FIG. 12A, FIG. 12B and FIG. 12C show the top view, the side view and the bottom view of a filter cover part of the AFEU as shown in FIG. 10A.
Figure 13A:
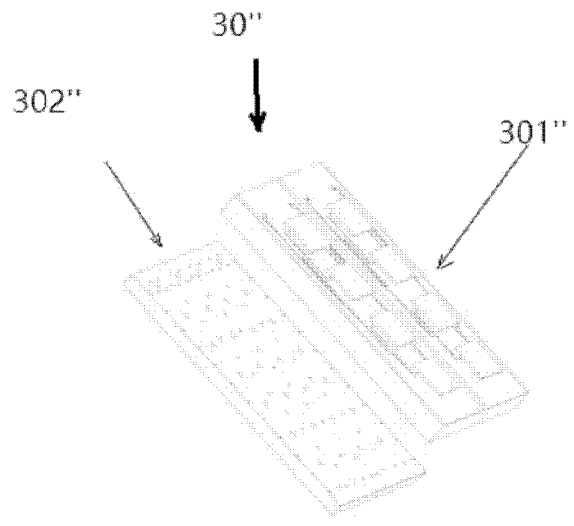
FIG. 13A shows the exploded view of an AFEU according to a third embodiment of the disclosure for a small cell RRU product.
Figures 13B, 13C, 13D:
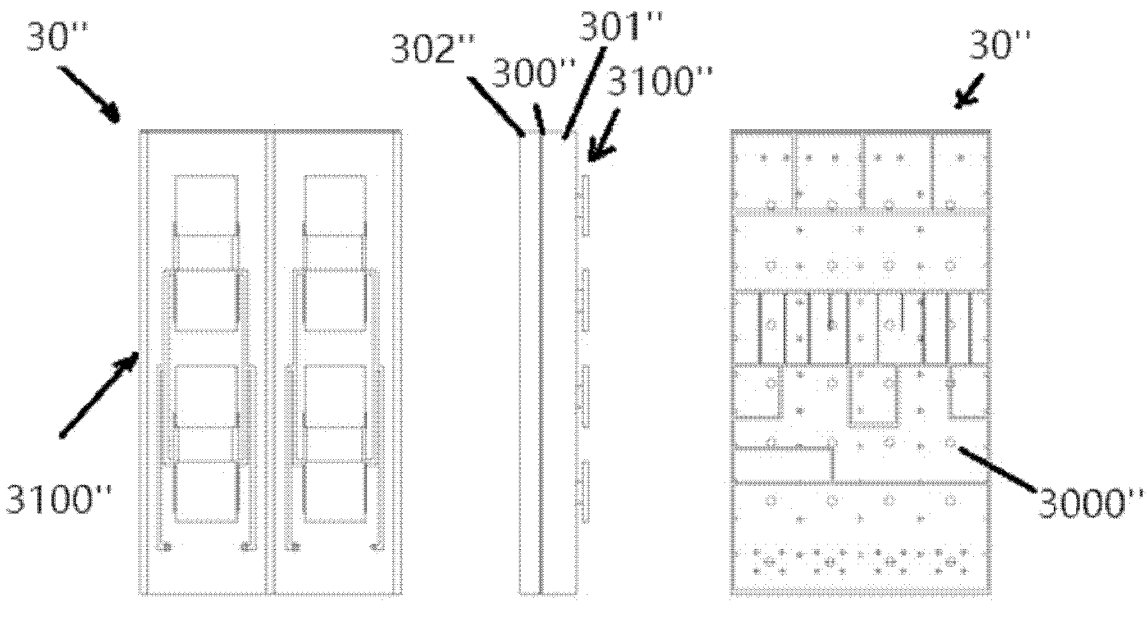
FIG. 13B, FIG. 13C and FIG. 13D show the top view, the side view and the bottom view of the AFEU as shown in FIG. 13A.

FIGS. 10A-10D show an AFEU 30' according to a second embodiment of the present disclosure. The core member of the AFEU 30' is a main body 300' defining a cavity filter. The main body 300' of the AFEU is formed by joining a filter chassis part 301' and a filter cover part 302'. Different from the AFEU according to the first embodiment, the AFEU 30' according to the second embodiment has an antenna unit 3100' integrated into the filter chassis part 301', as shown in FIGS. 11A-11C. And FIGS. 12A-12C show that an EMC cover 3000' is integrated into the filter cover part 302'.

Referring to FIGS. 11A-11C, the filter chassis part 301' comprises a base portion 3010' made of plastic. The plastic base portion 3010' can be shaped simply by molding to comprise bar structures on the upper side and a cavity structure and resonance structures 3012' on the lower side. The bar structures may then be metalized on their surfaces by a plastic plating method, and therefore can play as antenna isolation bars 3103'. The isolation bars are made integral with the plastic base portion 3010', and provided between groups of the radiators 3102', such that mutual coupling effect between different groups of radiators can be reduced. The feeding network 3101' and radiators 3102' of the antenna unit 3100' can be integrally formed by a plastic plating method on the upper side of the plastic base portion 3010'. The opposite side (or "inner-side") of the plastic base portion 3010' is metalized by a plastic plating method so as to provide a filtering function on one hand, and play as a reflector 3104' for the antenna unit 3100' on the other hand.

The filter cover part 302' also comprises a base portion 3020' made of plastic. The plastic base portion 3020' can be made by molding into a shape as required. The top side of the plastic base portion 3020' is metalized by a plastic plating method so as to achieve the function of filtering. Relief structures are integrally formed by molding on the bottom side ("outer-side") of the plastic base portion 3020'. The bottom side of the plastic base portion 3020', which is provided with recesses integrally molded for housing components on the radio board, is metallized by a plastic plating method so that it may serve as an EMC cover 3000' for providing shielding function.

Although the above embodiments are explained as examples for AAS product, the integration method applied in these embodiments can also be applicable to a Street Micro station, a small cell BS and other AIR products.

FIG. 13A-13D show an example of AFEU 30'' for a small cell RRU product, in which the AFEU 30'' consists of a filter chassis part 301'' and a filter cover part 302'', and the filter chassis part 301'' has an antenna unit 3100'' integrated therein, and the filter cover part 302'' has an EMC cover 3000'' integrated therein. Also, it is readily conceivable that the positions of the EMC cover 3000'' and the antenna unit 3100'' can be interchanged by integrating the EMC cover 3000'' into the filter chassis part 301'' and the antenna unit 3100'' into the filter cover part 302''.

FIG. 14A-14D show another example of AFEU 30''' for a Street Macro RRU product, in which the AFEU 30''' also consists of a filter chassis part 301''' with an antenna unit 3100''' integrated therein and a filter cover part 302''' with an EMC cover 3000' integrated therein. As a variant, the filter chassis part 301''' can be formed to have an EMC cover 3000' integrated therein, and the filter cover part 302''' can be formed to have an antenna unit 3100' incorporated therein.

Connections Involved in the Integrated Product
Connector for an Antenna in a Radio Unit with FEU FIGS. 15A and 15B show schematically the connection between a FEU 20, 20' and a radio board 102. From FIG. 15A, it can be seen that the filter chassis part 201 is placed below the filter cover part 202. So, it is the filter chassis part 201 that couples to the radio board 102 by a RF connector 50. While FIG. 15B shows that the filter cover part 202' is placed below the filter chassis part 201' and hence it is the filter cover part that couples to the radio board 102 via the RF connector 50.

However, no matter whether the filter chassis part is placed below the filter cover part, ANT connector 60 may be integrally formed during the molding of the base portion of the chassis part. The ANT connector 60 is embodied in the form of a hollow protrusion protruding outwardly from the wall of the base portion of the chassis part 201. The protrusion defines a through hole with a connector pin being inserted therethrough. Or, simply as a variant, the hole may be metalized on its inner side so that no connector pin is needed for coupling to an outer antenna element. The ANT connector 60 is used as an antenna port to be connected with an outer antenna element.

Although it is illustrated that the ANT connector is integrally formed with the filter chassis part of the FEU of the present disclosure, traditional connectors can also be used in the FEU of the present disclosure.

Connection Between the Filter and the Antenna Unit

FIGS. 16A and 16B show the connection structure for signal transition between the antenna unit 3100 and the cavity filter. The connection structure 40 can be embodied in the form of a pin. FIG. 16A shows an arrangement in which the antenna unit 3100 is integrated into the filter cover part 302 of the AFEU 30. In this case, the pin extends from the feeding network across the filter cover part 302 and protrudes to the cavity provided in the filter chassis part 301. While, for the arrangement of FIG. 16B in which the antenna unit 3100' is integrated into the filter chassis part 301' of the AFEU 30', the pin extends directly into the cavity provided in the filter chassis part 301'. Instead of a pin, a coupling structure (for example, a hole with its inner surface metalized) can be provided for realizing a signal path between the antenna unit 3100, 3100' and the cavity filter.

Connecting Structure for Connection Between the Filter and the Radio Board

FIGS. 17A-17D show different embodiments of a connecting structure for feeding a signal from a radio board 102 to a FEU or an AFEU. The connecting structure 50 can be embodied the form of conventional connectors, for example, three-piece connector 50*a* (shown in FIG. 17A), one-piece connector 50*b* (shown in FIG. 17B) and a pin-connector 50*c* (shown in FIGS. 15A-15B, 16A-16B and 17C). Taking a pin connector as an example, it can be molded together with the plastic base portion of the filter chassis part or the filter cover part. By doing this, the whole structure of the radio unit can be made more compact and its assembly can be made easier. As a variant, a metalized hole can be formed in the plastic base portion of the filter chassis part or the filter cover part for cooperating with the connectors to provide a signal path as required.

Figure 17A:
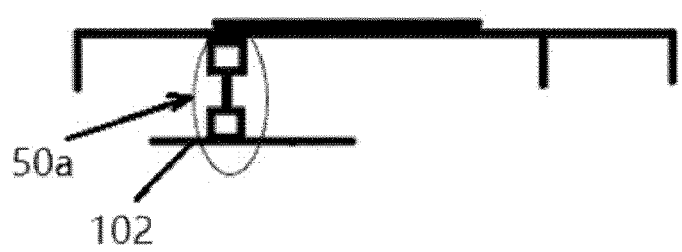
Figure 17B:
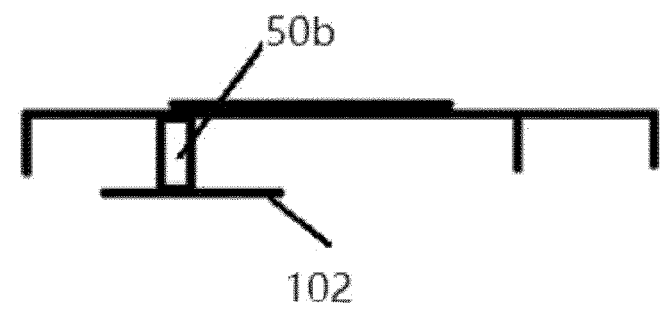
Figure 17C:
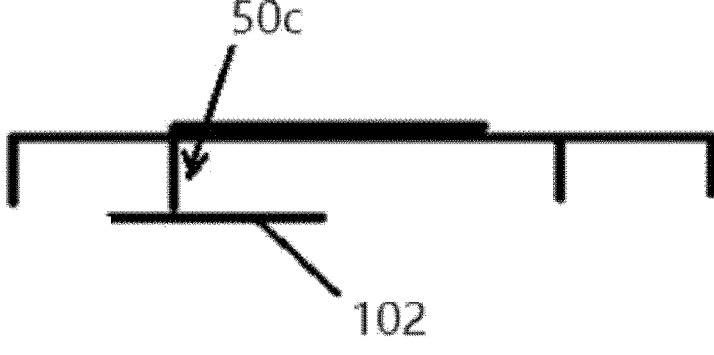
Figure 17D:
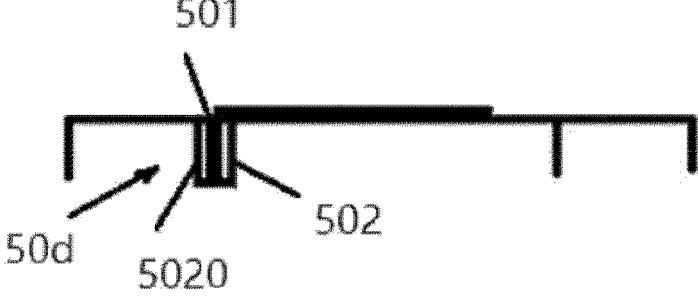

As shown in FIG. 17D, the radio board 102 is coupled to the cavity filter via a connecting structure 50*d* which comprises a core pin 501 and a hollow protrusion 502 extending towards the radio board and defining a through hole 5020 for receiving the core pin and holding the core pin coaxially between the radio board 102 and the filter cover part or the filter chassis part, wherein the protrusion 502 is integrally formed with an associated part of the main body of the cavity filter. Since the plastic molding and the plastic plating technology are used, the formation of the protrusion 502 can be easily completed and an outer surface of the protrusion 502 can be metalized in an easy manner as well.

The radio unit 1 of the present disclosure enables integration of high degree and also fully making use of the space available with less components, reduced weight and cost. Moreover, since the whole structure is simpler than traditional solutions, the production efficiency, especially assembling efficiency, will be improved a lot. Due to the high integration, and also since several standalone parts/connectors/fix screws are eliminated, the total BOM cost is reduced as well. Additionally, the PIM performance can be greatly improved due to seamless connection between the antenna unit and the EMC cover, as well as reduction of connectors and screws required. EMC performance can somehow be improved as well.

It can be easily understood that, the term "electrically coupled" means an electrical connection is realized either directly or indirectly, which allows transmission of the electric signal, and the terms "top" and "bottom", "upper" and "lower" refer to the sides of the radio unit or its components when the radio unit is placed in a working position. The terms "inner-side" and "outer-side" refer to the sides of the filter chassis part or the filter cover part with respect to the cavity inside the cavity filter.

In embodiments illustrated in the above, the base portion for the filter chassis part or the filter cover part is made of plastic. Preferably, it is formed into one piece, for example, by injection molding. The plastic material may be selected from the group consisting of PE (Polyethylene), PP (Polypropylene), PVC (Polyvinyl Chloride), PET (Polyethylene Terephthalate), PS (Polystyrene), PA (Polyamide), PPS (Polyphenylenesulfide), PC (Polycarbonates) or PI (Polyimide Film). For example, the plastic material can be in the form of LCP (liquid crystal polymer). Since the materials for the base portion can be easily shaped by molding, higher consistency can be obtained and also higher production efficiency can be achieved.

For all kinds of the radio unit 1 of the present disclosure, the metallization process involved is not limited to plating. For example, hot stamping, printing, coating, or adhesives or the like can be used as well. The method of plating on plastic or the method of laser-direct-structuring is highly preferable for forming the radiators/feeding network/EMC cover on the base portion, because it can be performed easily with high efficiency. Additionally, it can help to reduce the volume of the radio unit effectively, and has huge benefit in terms of cost, weight, size and production while without degradation on RF (radio frequency) performance. Moreover, since no extra snap joins or connections are needed for the mounting of the radiators and the EMC cover, the number of the components required for their assembling can be reduced and lower cost can be obtained as a result.

The metal material for the metallization process can be selected from the group consisting of silver, copper, aluminum, gold, iron, manganese, titanium, chromium or the like.

References in the present disclosure to "an embodiment", "another embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A filter unit, comprising:

a cavity filter comprising a hollow main body, with an inner-side surface of the main body defining a closed cavity for housing resonance elements, and the main body is formed by joining a filter chassis part and a filter cover part covering the filter chassis part, wherein an outer-side surface of the filter chassis part or the filter cover part, facing a radio board that is electrically coupleable with the cavity filter, is metalized including a metal layer formed thereby and is configured as an electromagnetic compatibility (EMC) cover for blocking the radio board from electromagnetic interference, wherein the metal layer is metalized by plating on a base portion made of plastic, wherein the EMC cover is formed on the filter chassis part, and at least one of:

wherein the filter chassis part comprises the base portion made of plastic on which the metal layer is plated and the EMC cover is shaped by integrally molding, and wherein the filter chassis part comprises a base portion made of plastic and an antenna port is integrally formed during molding of the base portion of the filter chassis part.

2. The filter unit according to claim 1, wherein the EMC cover is formed on the filter cover part.

3. The filter unit according to claim 2, wherein the filter cover part comprises the base portion made of plastic on which the metal layer is plated, and the EMC cover is shaped by integrally molding.

4. The filter unit according to claim 1, wherein a connecting structure for the coupling between the radio board and the cavity filter is provided, comprising a protrusion integrally formed with the base portion on which the EMC cover is to be integrally formed and protruding towards the radio board, wherein the protusion comprises a hole which is provided for coaxially holding a pin towards the radio board, or an inner side of the hole is metalized without the need of inserting a pin therethrough.

5. An antenna filter unit, comprising:
a filter unit comprising
a cavity filter comprising a hollow main body, with an inner-side surface of the main body defining a closed cavity for housing resonance elements,
the main body is formed by joining a filter chassis part and a filter cover part covering the filter chassis part,
wherein an outer-side surface of the filter chassis part or the filter cover part, facing a radio board that is electrically coupleable with the cavity filter, is metalized including a metal layer formed thereby and is configured as an electromagnetic compatibility (EMC) cover for blocking the radio board from electromagnetic interference, wherein the metal layer is metalized by plating on a base portion made of plastic; and
an antenna unit electrically coupled with the filter unit, wherein the antenna unit comprises radiators and a feeding network that are integrally formed on an outer-side surface of one of the filter chassis part and the filter cover part, and a reflector integrally formed on an inner-side surface of the one of the filter chassis part and the filter cover part, wherein the EMC cover is integrally formed on an outer-side surface of the other one of the filter chassis part and the filter cover part.

6. The antenna filter unit according to claim 5, wherein the feeding network and the radiators are integrally formed on the outer-side surface of the filter cover part.

7. The antenna filter unit according to claim 6, wherein the filter cover part comprises a base portion made of plastic, and the radiators are formed on an outer side of the base portion of the filter cover part facing away from the filter chassis part, by integrally molding radiator structures on the base portion of the filter cover part and applying a plastic plating method to surfaces of the radiator structures molded, and the feeding network is integrally formed by a plastic plating method on the outer side of the base portion of the filter cover part.

8. The antenna filter unit according to claim 7, wherein the reflector is integrally formed by a plastic plating method on an inner side of the base portion of the filter cover part facing the filter chassis part.

9. The antenna filter unit according to claim 5, wherein the feeding network and the radiators are integrally formed on the outer-side surface of the filter chassis part.

10. The antenna filter unit according to claim 9, wherein the filter chassis part comprises a base portion made of plastic, and the radiators are formed on an outer side of the base portion of the filter chassis part facing away from the filter cover part, by integrally molding radiator structures on the base portion of the filter chassis part and applying a plastic plating method to surfaces of the radiator structures molded, and the feeding network is integrally formed by a plastic plating method on the outer side of the base portion of the filter chassis part.

11. The antenna filter unit according to claim 10, wherein the reflector is integrally formed by a plastic plating method on an inner side of the base portion of the filter chassis part facing the filter cover part.

12. The antenna filter unit according to claim 7, wherein an isolation bar for reducing mutual coupling effect between radiators is formed by integrally molding a bar structure during molding of the base portion of the filter cover part or the filter chassis part and applying a plastic plating method to a surface of the bar structure molded.

13. The antenna filter unit according to claim 5, wherein a pin or a coupling structure is provided in the antenna filter unit for signal transition or connection between the antenna unit and the filter unit.

14. The filter unit according to claim 3, wherein a connecting structure for the coupling between the radio board and the cavity filter is provided, comprising a protrusion integrally formed with the base portion on which the EMC cover is to be integrally formed and protruding towards the radio board, wherein the protusion comprises a hole which is provided for coaxially holding a pin towards the radio board, or an inner side of the hole is metalized without the need of inserting a pin therethrough.

15. The antenna filter unit according to claim 10, wherein an isolation bar for reducing mutual coupling effect between radiators is formed by integrally molding a bar structure during molding of the base portion of the filter cover part or the filter chassis part and applying a plastic plating method to a surface of the bar structure molded.

16. An antenna filter unit according to claim 5, wherein the filter unit or the antenna filter unit is electrically coupled to the radio board.

17. A radio unit, comprising a radio board and a filter unit, the filter unit comprising:
a cavity filter comprising a hollow main body, with an inner-side surface of the main body defining a closed cavity for housing resonance elements, and
the main body is formed by joining a filter chassis part and a filter cover part covering the filter chassis part,
wherein an outer-side surface of the filter chassis part or the filter cover part, facing the radio board that is electrically coupleable with the cavity filter, is metalized including a metal layer formed thereby and is configured as an electromagnetic compatibility (EMC) cover for blocking the radio board from electromagnetic interference, wherein the metal layer is metalized by plating on a base portion made of plastic,
wherein the EMC cover is formed on the filter cover part, the filter cover part comprises the base portion made of plastic on which the metal layer is plated, and the EMC cover is shaped by integrally molding.

18. The radio unit according to claim 17, wherein a connecting structure for the coupling between the radio board and the cavity filter is provided, comprising a protrusion integrally formed with the base portion on which the EMC cover is to be integrally formed and protruding towards the radio board, wherein the protusion comprises a hole which is provided for coaxially holding a pin towards the radio board, or an inner side of the hole is metalized without the need of inserting a pin therethrough.

* * * * *